United States Patent
Konishi et al.

(10) Patent No.: US 7,300,598 B2
(45) Date of Patent: Nov. 27, 2007

(54) SUBSTRATE PROCESSING METHOD AND APPARATUS

(75) Inventors: Nobuo Konishi, Nirasaki (JP);
Takayuki Toshima, Nirasaki (JP);
Takehiko Orii, Nirasaki (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 10/812,102

(22) Filed: Mar. 30, 2004

(65) Prior Publication Data
US 2004/0187896 A1 Sep. 30, 2004

(30) Foreign Application Priority Data
Mar. 31, 2003 (JP) ............................. 2003-095582

(51) Int. Cl.
*B44C 1/22* (2006.01)
*B08B 3/00* (2006.01)
*B08B 3/08* (2006.01)

(52) U.S. Cl. ........................... 216/92; 216/84; 216/99; 134/32; 134/33; 134/95.1

(58) Field of Classification Search .................. None
See application file for complete search history.

(56) References Cited

U.S. PATENT DOCUMENTS 6,096,233 A * 8/2000 Taniyama et al. ............. 216/92
6,333,275 B1 * 12/2001 Mayer et al. ................. 438/745
6,817,790 B2 * 11/2004 Toshima et al. ............ 396/604

FOREIGN PATENT DOCUMENTS

| JP | 4-287922 | | 10/1992 |
| JP | 04287922 | A * | 10/1992 |
| JP | 11067649 | A * | 3/1999 |
| JP | 2001284206 | A * | 10/2001 |

* cited by examiner

*Primary Examiner*—Anita Alanko
(74) *Attorney, Agent, or Firm*—Smith, Gambrell & Russell, LLP

(57) ABSTRACT

The invention relates to a process including a chemical liquid treatment and a rinse liquid treatment on a substrate, more particularly to a technique for reducing consumption of a chemical liquid while achieving uniform process and preventing particle generation. In a specific embodiment, the process is performed for removing a silicon oxide film formed on a silicon wafer. The process includes three subsequently performed steps, in which (1) diluted hydrofluoric acid (DHF), (2) DHF and de-ionized water (DIW), (3) DIW are supplied, respectively, onto a rotating wafer. Transition from step (1) to step (2) is done immediately before the hydrophilic silicon oxide film is dissolved to expose the underlying hydrophobic silicon layer.

6 Claims, 8 Drawing Sheets

SUBSTRATE PROCESSING METHOD AND APPARATUS

BACKGROUND OF THE INVENTION

1. Field of the Invention

The present invention relates to a method and an apparatus for processing a substrate, such as a semiconductor wafer and a glass substrate for a liquid crystal display (LCD), by using a chemical liquid and a rinse liquid.

2. Description of the Related Art

In order to obtain a reliable semiconductor device, it is very important to prevent particles from adhering on the wafer surface. Particles can adhere on the wafer surface in any process step in the semiconductor device manufacturing process. For example, JP4-287922A recites that particles are produced during a process for removing a silicon oxide film (i.e., natural oxide film) on a semiconductor wafer by using hydrofluoric acid (HF). In such a process, if a liquid film of HF breaks into droplets, particles can be produced by a reaction between the HF droplets and the surrounding atmosphere at the interface therebetween. The particles thus produced are difficult to remove by the subsequent rinse treatment.

JP4-287922A discloses a method for solving the above problem. The method includes a cleaning step of dissolving the silicon oxide film by HF, and a rinse step of removing HF by a rinse liquid, characterized in that the supply of the rinse liquid starts at the end stage of the cleaning step before stopping the supply of HF. According to the method, the generation of particles, due to the existence of HF in a form of droplet during a time period after stopping the supply of HF and before starting the supply of the rinse liquid, can be prevented.

However, the above method includes the following problem. At the end stage of the cleaning step, a large part of the silicon oxide film has been dissolved to expose the underlying silicon layer (the wafer itself). As the silicon layer is hydrophobic, HF must be supplied at a considerably large supply rate in order to maintain the liquid film of HF over the entire surface of the wafer. This results in increase in consumption of expensive HF, and is not preferable for environmental reasons.

SUMMARY OF THE INVENTION

The present invention is made in view of the aforementioned circumstances, and therefore the object of the present invention is to provide a method and an apparatus capable of reducing the consumption of chemical liquid, while avoiding particle generation and achieving uniform treatment.

In order to achieve the objectives, the present invention provides a substrate processing method including the steps of: (i) supplying a chemical liquid on a rotating substrate to form a film of the chemical liquid on a surface of the substrate; (ii) supplying a rinse liquid on the rotating substrate to form a film of a mixture of the chemical liquid and the rinse liquid on the entire surface of the substrate; and (iii) removing the mixture from the surface of the substrate by the rinse liquid.

In one preferable embodiment, the step (i) is performed by moving a chemical liquid nozzle discharging the chemical liquid from a first position above a periphery of the substrate toward a second position above a center of the substrate; and the step (ii) is performed by moving a rinse liquid nozzle discharging the rinse liquid to follow the chemical liquid nozzle discharging the chemical liquid and moving from the first position toward the second position.

In one preferable embodiment, in the step (ii), the rinse liquid nozzle follows the chemical liquid nozzle while maintaining a distance between the nozzles within a predetermined range ensuring that the rinse liquid is mixed with the chemical liquid before the film of the chemical liquid spreading radially outward breaks into droplets.

In one preferable embodiment, the step (iii) is performed by supplying the rinse liquid, and a rinse liquid supplying rate in the step (iii) is greater than that in the step (ii).

In one preferable embodiment, the step (ii) includes the steps of: stopping supplying the chemical liquid when the chemical liquid nozzle reaches the second position above the center of the substrate; moving the rinse liquid nozzle toward the center of the substrate, while continuing discharging the rinse liquid from the rinse liquid nozzle, and the step (iii) includes the steps of: continuing supplying the rinse liquid from the rinse liquid nozzle while the rinse liquid nozzle being positioned above the center of the substrate; and increasing a rotation speed of the substrate.

In one preferable embodiment, a rinse liquid supplying rate in the step (iii) is greater than that in the step (ii).

In one preferable embodiment, the step (i) is performed by discharging the chemical liquid from a chemical liquid nozzle located above a center of the substrate; and the step (ii) is performed by discharging the rinse liquid from a rinse liquid nozzle surrounding the chemical liquid nozzle and located above the center of the substrate.

In one preferable embodiment, in the step (ii), the chemical liquid nozzle continues discharging the chemical liquid.

According to another aspect of the present invention, there is provided a substrate processing apparatus, which includes: a spin chuck adapted to hold and rotate a substrate; a motor adapted to drive the spin chuck for rotation; a chemical liquid nozzle adapted to supply a chemical liquid onto the substrate held by the spin chuck; a rinse liquid nozzle adapted to supply a rinse liquid onto the substrate held by the spin chuck; a nozzle moving mechanism adapted to move the chemical liquid nozzle and the rinse liquid nozzle relative to the substrate held by the spin chuck; a chemical liquid control valve adapted to control a supply of the chemical liquid to the chemical liquid nozzle; a rinse liquid control valve adapted to control a supply of the rinse liquid to the rinse liquid nozzle; and a controller that controls the motor, the chemical liquid control valve, the rinse liquid control valve and the nozzle moving mechanism according to a predetermined sequence of operations, the operations including: (i) moving the nozzles, by operating the nozzle moving mechanism, from a first position above a periphery of the substrate toward a second position above a center of the substrate in such a manner that the rinse liquid nozzle follows the chemical liquid nozzle, while rotating the substrate held by the spin chuck by operating the motor, and while supplying the chemical liquid from the chemical liquid nozzle by operating the chemical liquid control valve, and supplying the rinse liquid from the rinse liquid nozzle by operating the rinse liquid control valve; and (ii) stopping supplying the chemical liquid from the chemical liquid nozzle by operating the chemical liquid control valve when the chemical liquid nozzle reaches the second position above the center of the substrate, while continuing rotating the substrate, and continuing supplying the rinse liquid from the rinse liquid nozzle positioned above the center of the substrate.

In one preferable embodiment, in the operation (ii), a rinse liquid supply rate is increased by adjusting an opening of the rinse liquid control valve.

In one preferable embodiment, the nozzle moving mechanism includes a nozzle arm, to which both the chemical liquid nozzle and the rinse liquid nozzle are mounted in such a manner that the rinse liquid nozzle is located outside the chemical liquid nozzle with respect to a radial direction of the substrate when the nozzles are located above the substrate held by the spin chuck.

In one preferable embodiment, the nozzle moving mechanism includes a pair of nozzle arms, to which the chemical liquid nozzle and the rinse liquid nozzle are mounted, respectively.

In one preferable embodiment, the controller is configured to control the nozzle moving mechanism in the operation (ii) so that a distance between the chemical liquid nozzle and the rinse liquid nozzle is maintained within a range ensuring that the rinse liquid is mixed with the chemical liquid spreading radially outward in a form of a film before the film breaks into droplets.

The present invention also provides a substrate processing apparatus, which includes: a spin chuck adapted to hold and rotate a substrate; a motor adapted to drive the spin chuck for rotation; a chemical liquid nozzle adapted to supply a chemical liquid onto the substrate held by the spin chuck; a rinse liquid nozzle adapted to supply a rinse liquid onto the substrate held by the spin chuck; a nozzle moving mechanism adapted to move the chemical liquid nozzle and the rinse liquid nozzle relative to the substrate held by the spin chuck; a chemical liquid control valve adapted to control a supply of the chemical liquid to the chemical liquid nozzle; and a rinse liquid control valve adapted to control a supply of the rinse liquid to the rinse liquid nozzle; wherein the chemical liquid nozzle and the rinse liquid nozzle comprise an inner tube and an outer tube, the inner tube serving as the chemical liquid nozzle, and the outer tube surrounding the inner tube to define an annular gap, serving as a liquid passage for the rinse liquid nozzle, between the tubes.

In one preferable embodiment, a tip of the outer tube is positioned lower than a tip of the inner tube.

In one preferable embodiment, a tip portion of the inner tube is tapered toward a tip of the inner tube.

In one preferable embodiment, the apparatus further includes a controller that controls the chemical liquid control valve and the rinse liquid control valve according to a predetermined sequence of operations, the operations including: (i) supplying the chemical liquid from the chemical liquid nozzle by operating the chemical liquid control valve, without supplying the rinse liquid; (ii) thereafter, concurrently supplying the chemical liquid and the rinse liquid from the chemical liquid nozzle and the rinse liquid nozzle, respectively, by operating at least the rinse liquid control valve; and (iii) thereafter, stopping supplying the chemical liquid nozzle while continuing supplying the chemical liquid, by operating at least the chemical liquid control valve.

DESCRIPTION OF THE PREFERRED EMBODIMENTS

Figure 1:
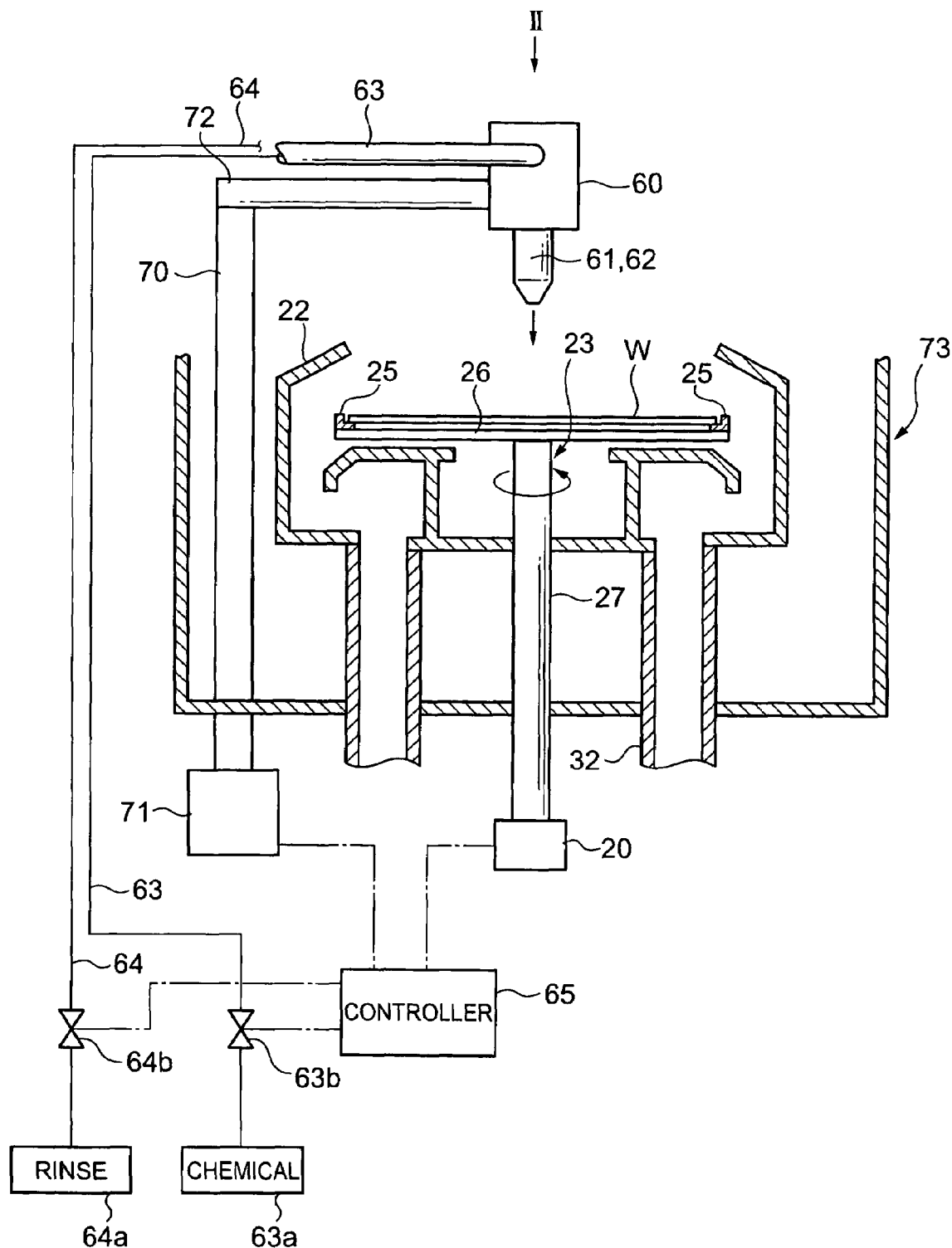
FIG. 1 is a cross-sectional view of a substrate processing apparatus in a first embodiment of the present invention.
Figure 2:
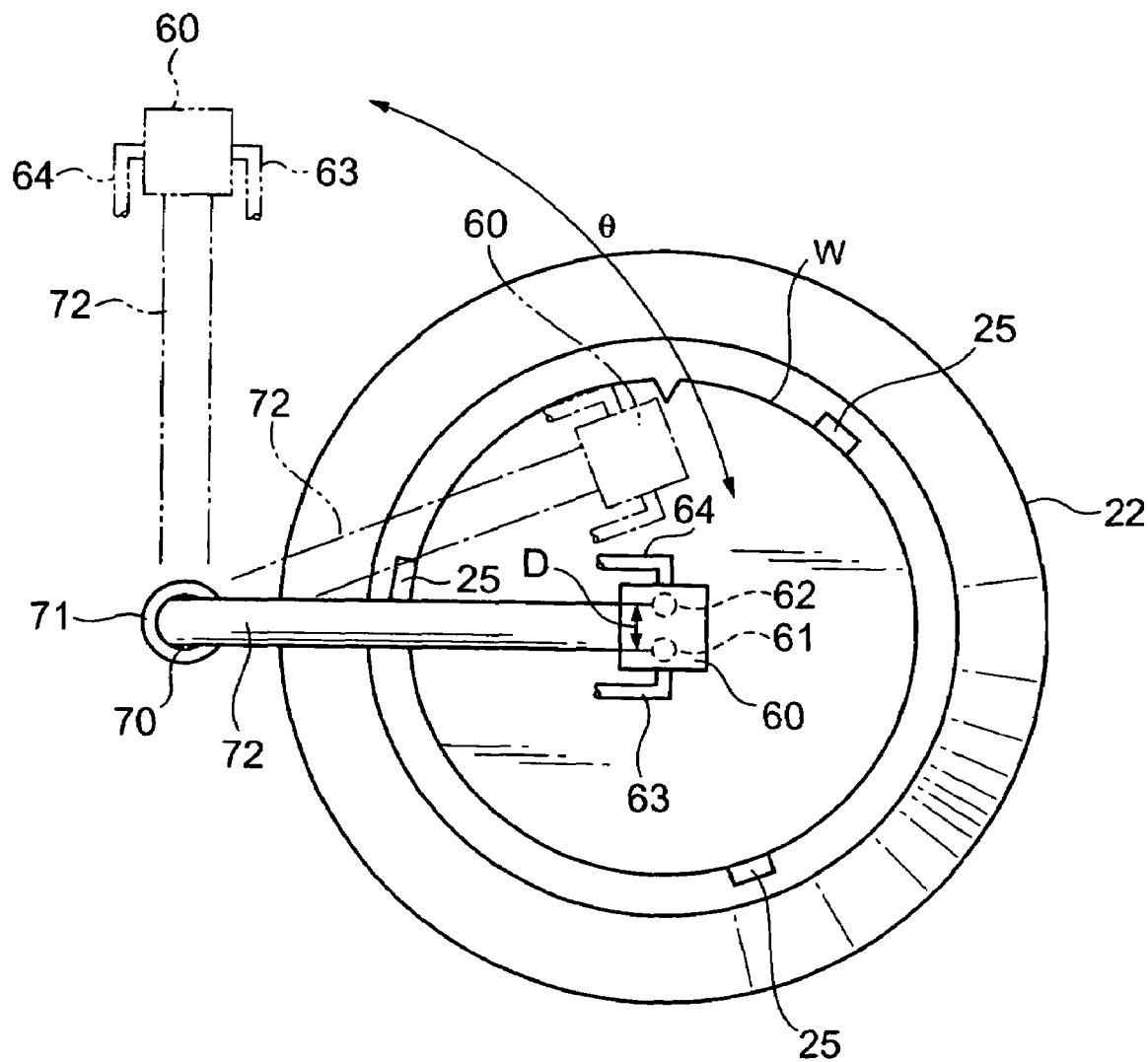
FIG. 2 is a top plan view of the apparatus shown in FIG. 1.
Figure 3:
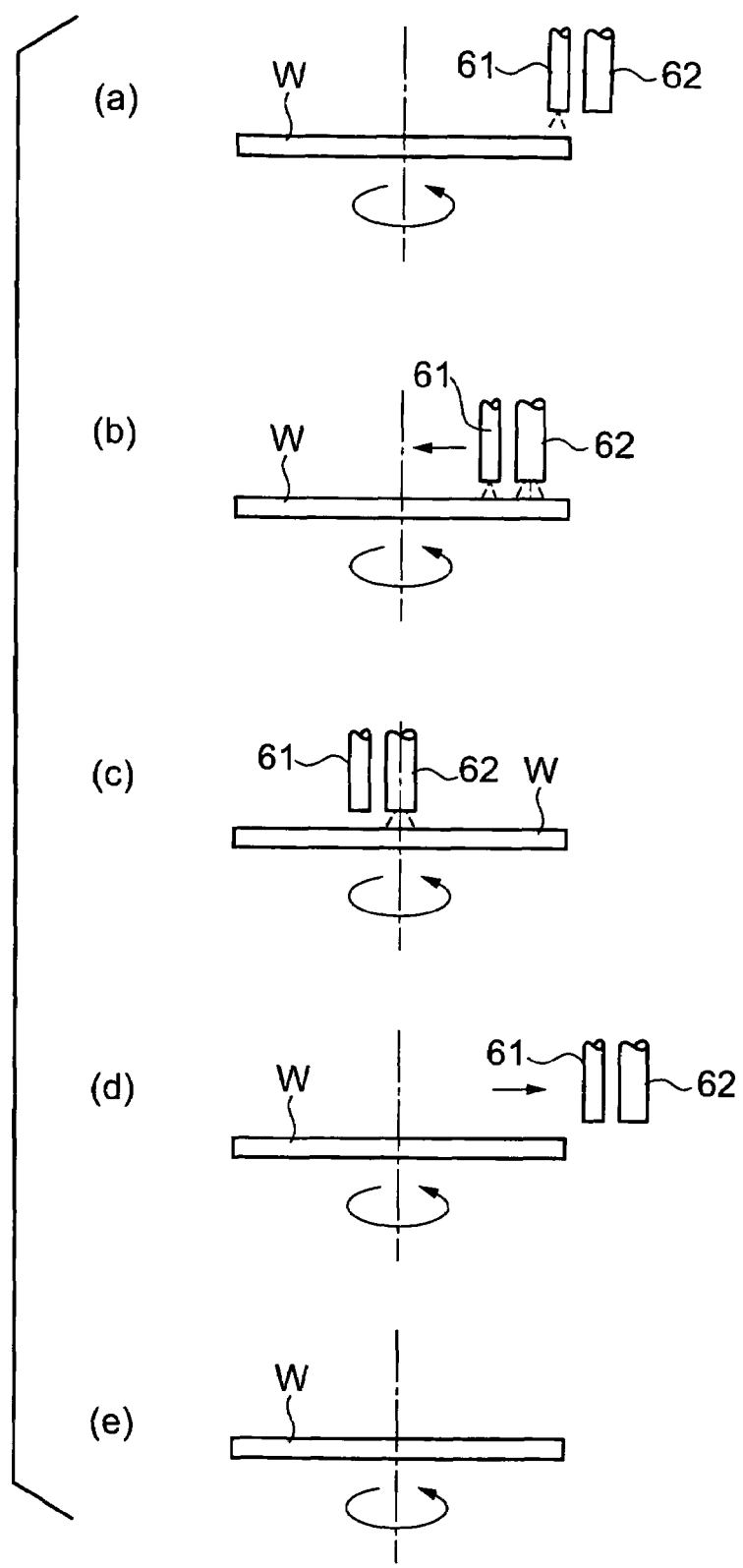
FIGS. 3(a)-3(e) show a sequence of operations of the apparatus shown in FIG. 1.

Referring to FIGS. 1 to 3, a substrate processing apparatus includes a casing 73. The casing 73 accommodates a spin chuck 23 to hold and rotate a semiconductor wafer W (i.e., a substrate to be processed); a cup 22 to surround the spin chuck 23 and the wafer W; and an integrated nozzle unit 60 to supply a chemical liquid and a rinse liquid (i.e., processing liquids) onto the wafer W. The rinse liquid is typically de-ionized water (DIW).

The spin chuck 23 is composed of: a chuck plate 26 connected to an upper end of a rotation shaft 27 rotationally driven by a motor 20 arranged at a bottom portion of the casing 73; and holding members 25 arranged at a periphery of the chuck plate 26. The holding member 25 holds a periphery of the wafer W so that a vertical gap exists between the wafer W and the chuck plate 26.

An atmosphere in the cup 22 can be sucked from the bottom portion thereof by an exhaust means (not shown), such as a vacuum pump, arranged outside the casing 73. The processing liquid scattered due to the rotation of the wafer W is drained from the cup 22 through a drainage 32 connected to the bottom of the cup 22.

The integrated nozzle unit 60 is mounted to the distal end of the swing arm 72, which turns about a rotation shaft 70 on a horizontal plane. A chemical liquid supply pipe 63 connected to a chemical liquid source 63a and a rinse liquid supply pipe 64 connected to a rinse liquid source 64a are connected to the nozzle unit 60.

The integrated nozzle unit 60 includes a chemical liquid nozzle 61 connected to the chemical liquid supply pipe 63 to supply the chemical liquid onto the wafer W, and a rinse liquid nozzle 62 connected to the rinse liquid supply pipe 64 to supply the rinse liquid onto the wafer W.

These nozzles 61 and 62 open downwardly, and are adjacently arranged in the nozzle unit 60 while being spaced at distance D (see FIG. 2) in such a manner that the rinse liquid nozzle 62 is located radially outside the chemical liquid nozzle 61 when the nozzle unit 60 is in a working position above the wafer W held by the spin chuck 23.

A chemical liquid control valve 63b and a rinse liquid control valve 64b are arranged in the chemical liquid supply pipe 63 and the rinse liquid supply pipe 64, respectively. Each of the valves 63b and 64b is capable of being opened and closed (shut-off), and the opening thereof can be adjusted. Thus, supply of the chemical liquid form the chemical liquid nozzle 61 and supply of the rinse liquid from the rinse liquid nozzle 62 can be controlled independently.

A rotation shaft 70 vertically extends outside the cup 22. A motor 71 drives the rotation shaft 70 for rotation. The swing arm 72 is horizontally fixed, at the proximal end thereof, to the upper end of a rotation shaft 70. Upon operation of the motor 71, the swing arm 72 can turn in θ-directions on a horizontal plane about a vertical axis, as shown in FIG. 2. The swing arm 72 indicated by solid lines is positioned above the center of the wafer W, and that indicated by chain double-dotted lines is positioned at standby position (home position) outside the cup 22.

A controller 65 is connected to the motor 20 for the spin chuck 23, the motor 71 for the swing arm 72, the chemical liquid control valve 63b and rinse liquid control valve 64b to control their operations to carry out a predetermined sequence of operations, which will be described below.

The operation of the substrate processing apparatus will be described by way of example in which: (i) the wafer W has a silicon oxide film as the uppermost layer thereof; (ii) a silicon layer (the wafer itself) exists directly below the silicon oxide film; (iii) the chemical liquid is diluted hydrofluoric acid (DHF), and the rinse liquid is de-ionized water (DIW); and (iv) the treatment is carried out for removing the silicon oxide film.

The spin chuck 23 holds the wafer W, and then rotates at a first rotation speed (e.g., 500 rpm). The swing arm 72, which is placed at the home position, turns to locate the integrated nozzle unit 60 just outside the periphery of the wafer W. Then, the chemical liquid nozzle 61 and the rinse liquid nozzle 62 start to discharge DHF and DIW, respectively. Alternatively, the chemical liquid nozzle 61 and the rinse liquid nozzle 62 may start discharging DHF and DIW, respectively, when the nozzles 61 and 62 are located at a position right above the periphery of the wafer W, respectively (See FIG. 3(a)).

The swing arm 72 turns to move the integrated nozzle unit 60 toward a position above the center of the wafer W at a predetermined moving speed, while the nozzles 61 and 62 continuing discharging DHF and DIW at first discharge rates (e.g., 0.1 l/min each), respectively (See FIG. 3(b)). The moving speed of the nozzle unit 60 is such that the time required for the nozzle unit 60 moving from the periphery of the wafer W to the center of the wafer W is one minute, for example. The situation is also shown in FIGS. 4A and 4B.

Due to the aforementioned arrangement of the nozzles 61 and 62, DHF discharged from the chemical liquid nozzle 61 falls on a relatively inner portion of the wafer W, and DIW discharged from the rinse liquid nozzle 62 falls on the wafer at a relatively outer portion of the wafer W.

Figure 4A:
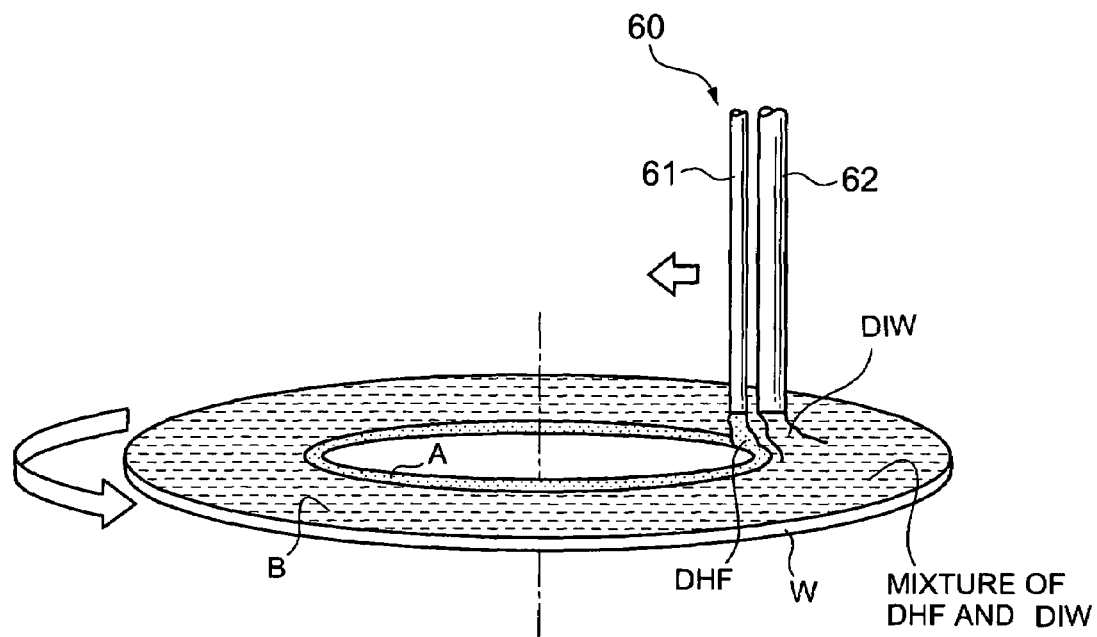
FIGS. 4A and 4B show liquid films formed on a wafer.
Figure 4B:
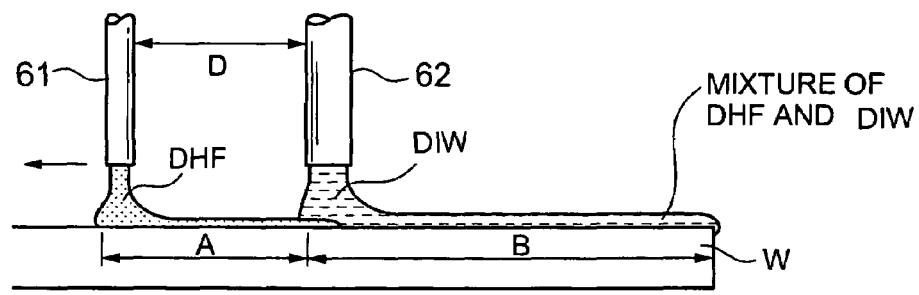

When DHF contacts the wafer W, it immediately spreads radially outward due to a centrifugal force to form a liquid film of DHF, which covers a ring-shaped area A of the wafer W (see FIG. 4A). DIW discharged from the rinse liquid nozzle 62 falls on the liquid film of DHF, and is mixed with DHF to form a mixture of DHF and DIW (i.e., water-diluted DHF). The mixture spreads radially outward due to a centrifugal force to form a liquid film of the mixture, which covers a ring-shaped area B of the wafer W, which extends radially outside the area A to the periphery of the wafer W.

The area A moves radially inward according to the movement of the integrated nozzle unit 60. Thus, each of the portions of the wafer W firstly contacts DHF, and then contacts the mixture of DHF and purer water. In the area A, DHF having relatively high HF concentration contacts the wafer W, and thus reacts with the silicon oxide film at a relatively high reaction rate. In the area B, water-diluted DHF having relatively low HF concentration contacts the wafer W, and thus reacts with the silicon oxide film at a relatively low reaction rate.

In each of the portions of the wafer W, a considerably large amount of the silicon oxide film on the portion is etched by DHF while the ring-shaped DHF film (area A) exists on the portion, and then the remaining amount of the silicon oxide film on the portion is etched by the water-diluted DHF while the ring-shaped, water-diluted DHF (area B) exists on the portion.

In order to achieve in-plane uniformity of the etching process, the moving speed of the integrated nozzle unit 60 is increased continuously or step-by-step, as the nozzle unit 60 approaches the position above the center of the wafer W. In a specific embodiment, the moving speed of the nozzle unit 60 is varied in three stages.

When the hydrophilic silicon oxide film is completely dissolved in a portion of the wafer W, the hydrophobic silicon layer (the wafer W itself) is exposed to DHF in the portion. Under the circumstances, maintaining DHF in its film-shaped form becomes difficult, and the DHF film tends to break into droplets. This results in generation of particles, as previously mentioned. In order to avoid this, the conventional method must supply a considerably large amount of DHF to maintain the DHF film, after the hydrophobic silicon layer is exposed.

However, in this embodiment of the present invention, as the rinse liquid nozzle 62 discharging DIW follows the chemical liquid nozzle 62, a sufficient amount of liquid (i.e., water-diluted DHF) exists in the area B of the wafer W. Therefore, a liquid film can be maintained in the area B even if the hydrophobic layer is exposed. After each of the portions of the wafer W initially contacts DHF, the portion will be continuously covered with a continuous liquid film and never be exposed to the surrounding atmosphere, until the drying process starts.

The distance D between the chemical liquid nozzle 61 and the rinse liquid nozzle 62 is determined so as to ensure that DIW discharged from the rinse liquid nozzle 62 is added to DHF before the DHF film breaks into droplets. However, it is not preferable that the distance D is too small. In such a case, DHF having relatively high HF concentration does not contact the wafer surface for a sufficiently long time, resulting in the deterioration in etching efficiency. Preferably, the distance D is such that DIW is added to the DHF film immediately before the DHF film breaks into droplets: The distance D can be experimentally determined by those skilled in the art, considering the DHF discharge rate from the chemical liquid nozzle 61, the DIW discharge rate from the rinse liquid nozzle 62, the moving speed of the integrated nozzle unit 60, the rotation speed of the wafer W, and the characteristics of the layers of the wafer W.

When the chemical liquid nozzle 61 reaches a position right above the center of the wafer W, the nozzle 61 stops discharging DHF, while the rinse liquid nozzle 62 continues discharging DIW. The integrated nozzle unit 60 continues to move until the rinse liquid nozzle 62 reaches a position right above the center of the wafer W, at which point the nozzle unit 60 stops moving. At this point, the wafer surface is entirely covered with the water-diluted DHF film, and the chemical liquid nozzle 61, which stops discharging DHF, locates at a position beyond the center of the wafer W at the distance D. The rinse liquid nozzle 62 stays at the position right above the center of the wafer W, and continues discharging DIW onto the wafer W to rinse the wafer surface for a predetermined time period (e.g., 30 seconds) (See FIG. 3(c)). When rinsing the wafer W, the DIW discharge rate of the rinse liquid nozzle 62 is increased up to a second discharge rate (e.g., 5 l/min), and the rotation speed of the wafer W is increased up to a second rotation speed (e.g., 1000 rpm).

After the completion of the rinsing of the wafer W, the rinse liquid nozzle 62 stops discharging DIW, and the swing arm 72 is returned to the home position (See FIG. 3(d)). Thereafter, the rotation speed of the wafer W is further increased up to a third rotation speed (e.g., 3000 rpm) to scatter DIW remaining on the wafer W by the centrifugal force, and thereby the wafer W is dried (See FIG. 3(e)). The rotation of wafer W at the third rotation speed continues for a predetermined time period (e.g., 30 seconds). Alternatively, the rinse liquid nozzle 62 may continue discharging DIW until the rinse liquid nozzle 62 passes the periphery of the wafer W when returning to the home position.

According to this embodiment, at least two remarkable advantages can be achieved. First, the DHF supplying rate can be reduced as long as DHF film can be maintained in the area A. This results in reduction of consumption of expensive DHF, resulting in reduction of running cost of the apparatus. Second, the silicon layer is not exposed to DHF having a high HF concentration for a long time after the overlying silicon oxide film has been dissolved. This prevents undesirable damage to the silicon layer, and achieves uniform etching of the wafer W.

Figure 5:
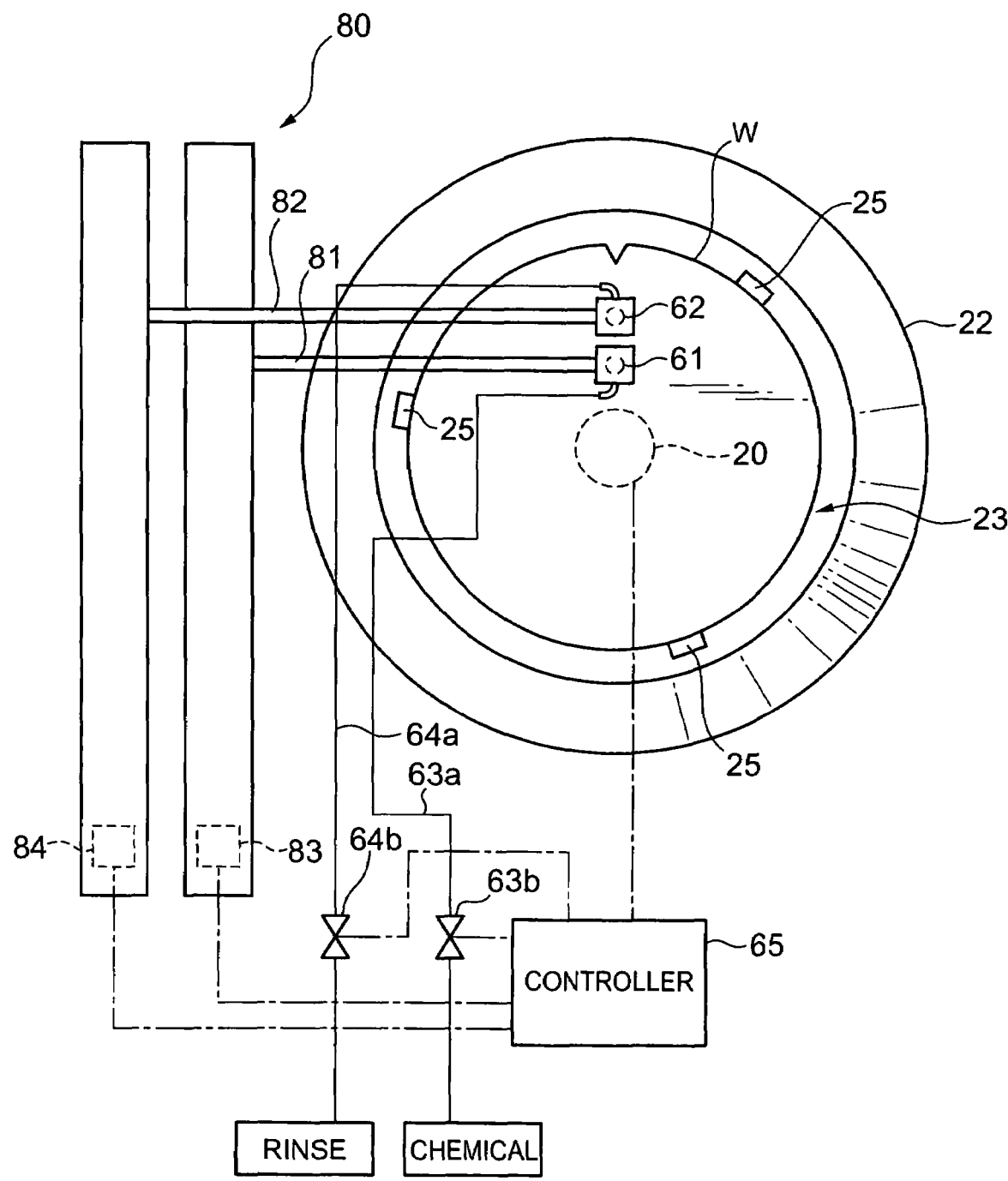
FIG. 5 is a cross-sectional view of a substrate processing apparatus in one modification.

FIG. 5 shows a modification of the processing apparatus. The apparatus is provided with a nozzle moving mechanism 80 adapted to move the chemical liquid nozzle and the rinse liquid nozzle linearly, instead of the swing arm 72. In this modification, the chemical liquid nozzle 61 and the rinse liquid nozzle 62 are not integrated. The nozzle moving mechanism 80 includes a pair of nozzle arms, namely a first nozzle arm 81 and a second nozzle arm 82, which carry the chemical liquid nozzle 61 and the rinse liquid nozzle 62, respectively.

The first nozzle arm 81 is driven by a motor 83 for linear movement so that the chemical liquid nozzle 61 carried by the nozzle arm 81 moves along a straight line extending horizontally to pass a point right above the center of the wafer W. The motor 83 may be a linear motor. Alternatively, the motor 83 may be a revolving motor. In such a case, a device, which converts a rotational movement of the motor into a linear movement, is provided. The second nozzle arm 82 is also driven by a motor 84 for linear movement in the same manner as that in which the nozzle arm 81 is driven, so that the rinse liquid nozzle 62 carried by the nozzle arm 82 moves along a straight line extending horizontally to pass a point right above the center of the wafer W. The controller 65 controls the operation of the motors 83 and 84 separately, to control the movement of the nozzle arms 81 and 82 independently.

Also in this modification, the motor 20 for the spin chuck 23, the chemical liquid control valve 63b and the rinse liquid control valve 64b are controlled by the controller 65. The processing apparatus in this modification operates in essentially the same manner as that in which the apparatus shown in FIGS. 1 and 2 operates, to perform the aforementioned sequence of operations. In a specific modification, the nozzles 61 and 62 move from a position above the periphery of the wafer W to a position above the center of the wafer W while discharging DHF and DIW, respectively, with the nozzles 61 and 62 being spaced at distance D (D is constant.).

However, in an alternative modification, the distance D between the nozzles 61 and 62 may be varied during the movement of the nozzles 61 and 62 from the periphery to the center of the wafer W. For example, as the peripheral velocity of the wafer W at the peripheral portion of the wafer W is higher than that at the central portion of the wafer on the condition that the angular velocity of the wafer W is constant, the distance D may be shortened according to the proximity of the nozzles 61 and 62 to the periphery of the wafer W.

Figure 6:
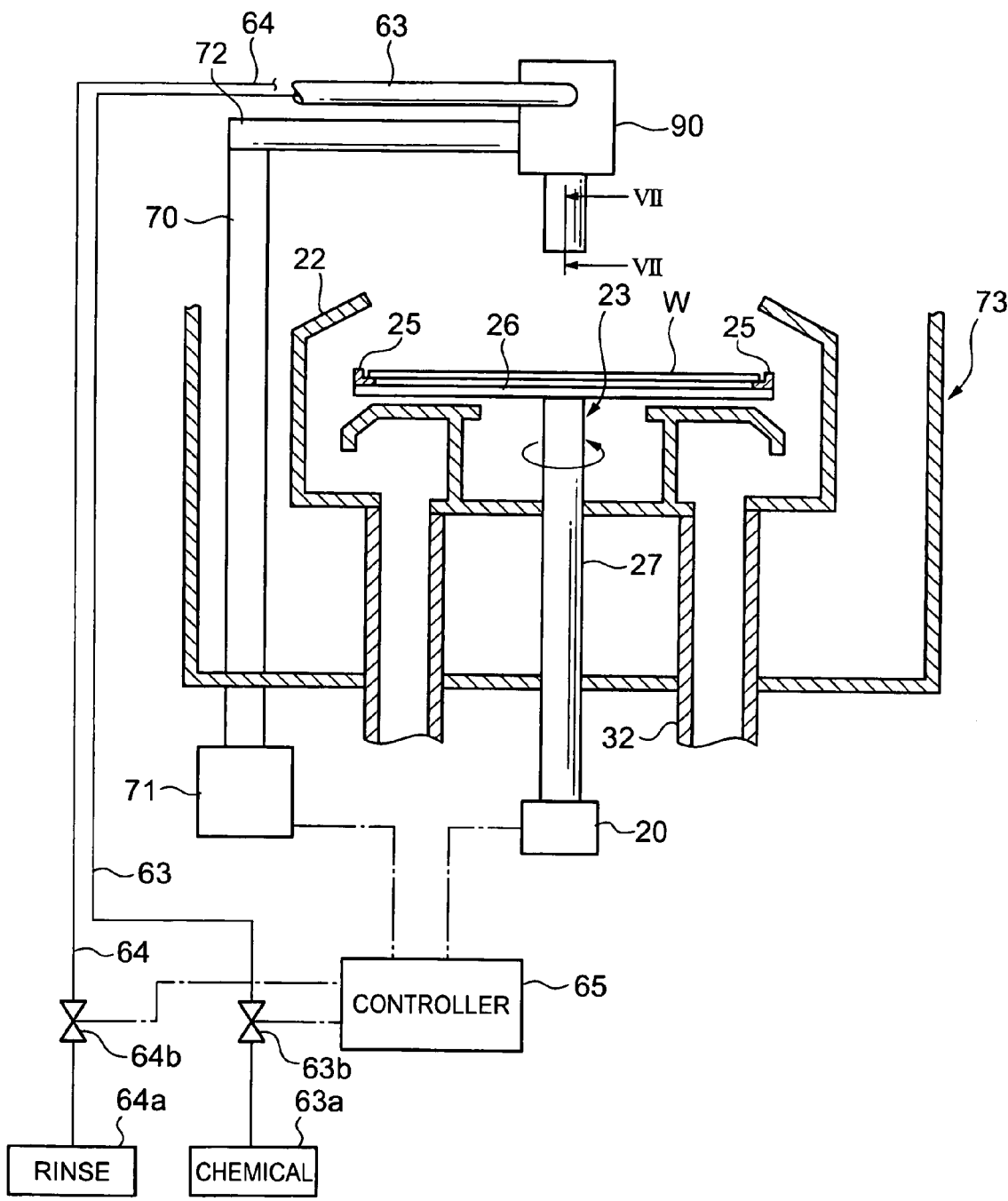
FIG. 6 is a cross-sectional view of a substrate processing apparatus in a second embodiment of the present invention.
Figure 7:
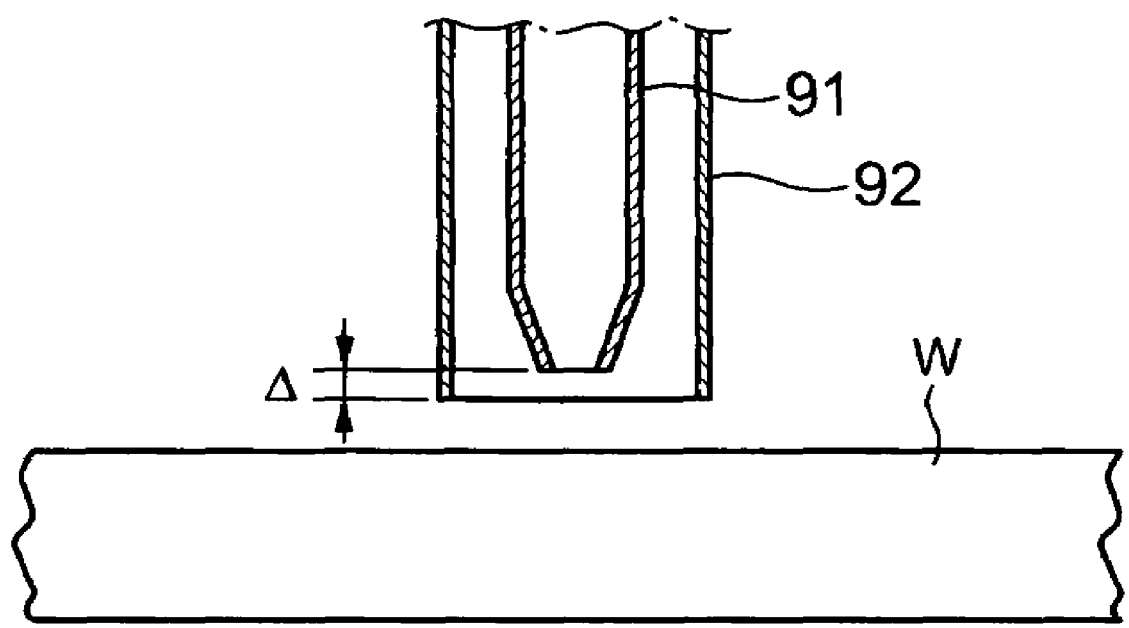
FIG. 7 is a cross-sectional view of an integrated nozzle unit taken along line VII-VII in FIG. 6.
Figure 8:
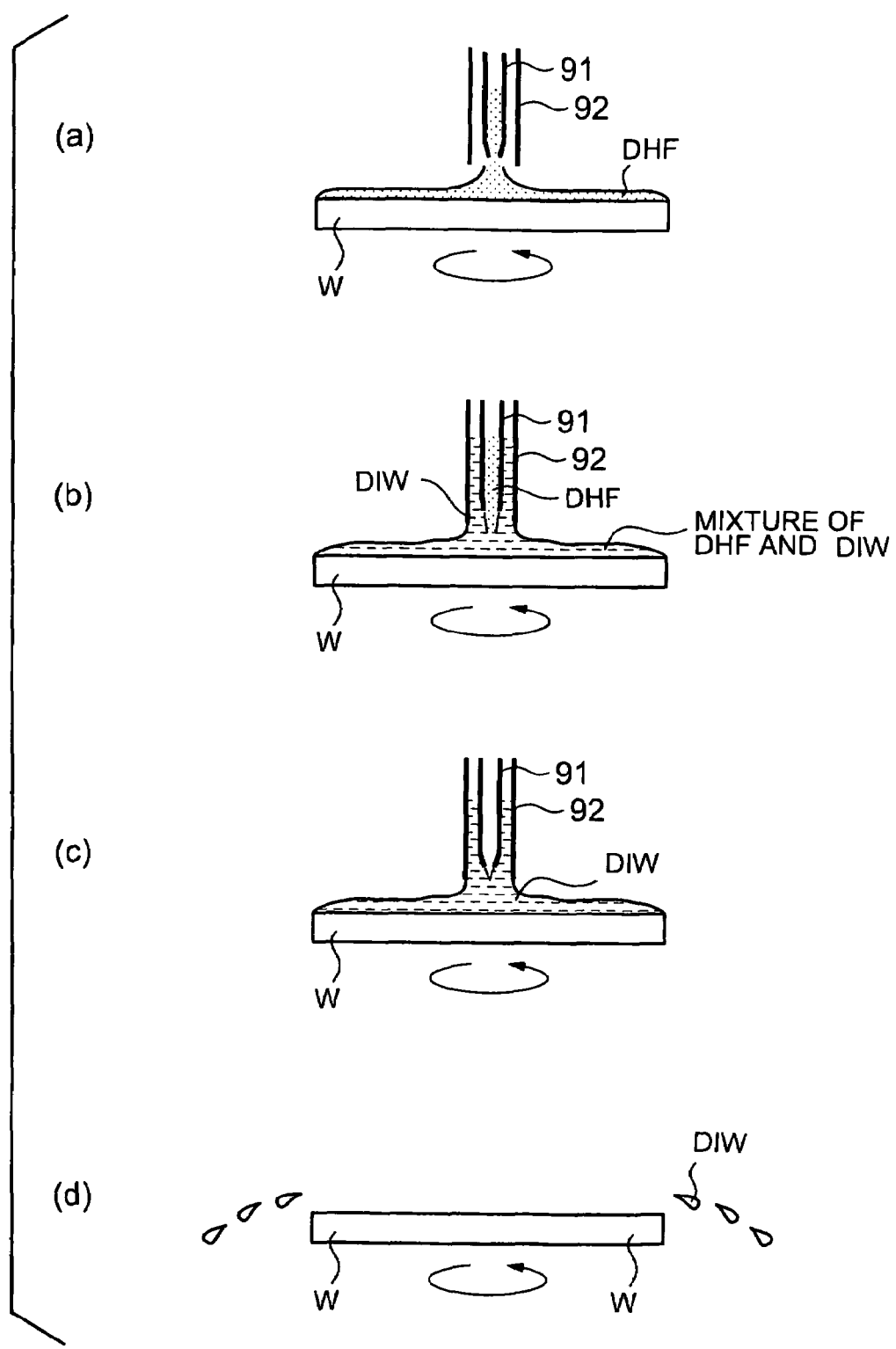
FIGS. 8(a)-8(d) show a sequence of operations of the apparatus shown in FIG. 6.

The second embodiment of the substrate processing apparatus according to the present invention will be described with reference to FIGS. 6 to 8. The structure of the substrate processing apparatus in the second embodiment differs from that in the first embodiment only in the structure of the integrated nozzle unit.

In the second embodiment, an integrated nozzle unit 90 is of a double-tube structure having an inner tube 91 serving as a chemical liquid nozzle and an outer tube 92 surrounding the inner tube 91. The inner and outer tubes 91 and 92 arranged concentrically so as to define therebetween an annular gap, to which a rinse liquid is supplied from the rinse liquid source 64a to be discharged onto the wafer W. The chemical liquid source 63a is connected to the inner tube 92 to feed a chemical liquid thereto.

The operation of the substrate processing apparatus in the second embodiment will be described by way of example in which: (i) the wafer W has a silicon oxide film as the uppermost layer thereof; (ii) a silicon layer (the wafer itself) exists directly below the silicon oxide film; (iii) the chemical liquid is diluted hydrofluoric acid (DHF), and the rinse liquid is de-ionized water (DIW); and (iv) the treatment is carried out for removing the silicon oxide film.

The swing arm 72 places the integrated nozzle unit 90 at a position right above the center of the wafer W held by the spin chuck 23. The nozzle unit 90 maintains its position until the rinse treatment is completed.

The spin chuck 23 rotates the wafer W at a first rotation speed, such as 500 rpm. Then, the inner tube 91 discharges DHF vertically downward onto the rotating wafer W at a first discharge rate (e.g., 0.1 l/min). DHF spreads radially outward due to a centrifugal force, to form a continuous liquid film which covers the entire surface of the wafer W. The discharge of DHF from the inner tube 91 at the first discharge rate without discharging DIW continues for a first time period (e.g., 30 seconds), during which the DHF film covering the entire surface of the wafer W is maintained, and thus the uppermost silicon oxide layer reacts with, or is etched by, DHF having a relatively high HF concentration. The above procedure is shown in FIG. 8(a), and is referred to as "chemical treatment step" hereinafter. In this chemical treatment step, a considerably large amount of the silicon oxide film is dissolved to be removed. The chemical treatment step is completed before the silicon oxide film is dissolved to such extent that at least a part of the underlying silicon layer is exposed. Thus, in this step, the DHF discharge rate may be small. This is because DHF contacts the hydrophilic surface, on which DHF can be maintained in a form of a film even though the DHF discharge rate is small.

Next, DIW is discharged at a first discharge rate (e.g., 0.1 l/min) of DIW from the gap between the inner and outer tubes 91 and 92 onto the wafer W continuing rotating at the first rotation speed, while continuing discharging DHF from the inner tube 91 at the first discharge rate of DHF. DHF and DIW thus discharged are mixed with each other to produce water-diluted DHF. The water-diluted DHF spreads radially outward to form a continuous liquid film which covers the entire surface of the wafer W. The simultaneous discharge of DHF and pure wafer continues for a second time period (e.g., 30 seconds), during which the water-diluted DHF film covering the entire surface of the wafer W is maintained, and thus the remaining silicon oxide layer reacts with, or is etched by, water-diluted DHF having a relatively low HF concentration. The above procedure is shown in FIG. 8(b), and is referred to as "chemical/rinse treatment step" hereinafter. This chemical/rinse treatment step is continued until the silicon oxide film is removed completely. The liquid feed rate (i.e., the sum of the DHF discharge rate and the DIW discharge rate) in the chemical/rinse treatment step is determined so that the liquid film of water-diluted DHF can be maintained even if the hydrophobic silicon layer partially or entirely exposed.

Preferably, in the chemical/rinse treatment step, the separately discharged DHF and DIW are mixed with each other as soon as possible after being discharged, in order to achieve uniform etching. To this end, the tip of the outer tube 92 is positioned lower than the tip of the inner tube 91 by a level difference Δ. This arrangement promotes mixing of DHF and DIW before they reach the wafer surface. In addition, the tip portion of the inner tube 91 is tapered toward its tip. The tapered outer circumference of the tapered portion guides DIW toward DHF discharged from the inner tube 91 to promote mixing of DHF and DIW. The tapered inner circumference of the tapered portion prevents unexpected dripping-off of DHF. It is also preferable that the integrated nozzle unit 90 is configured so that the inner and outer tubes 91 and 92 are capable of relative vertical movement to enable the adjustment of level difference Δ for the effective mixing of DHF and DIW.

Transition from the chemical treatment step to the chemical/rinse treatment step is preferably carried out just before the underlying hydrophobic silicon layer is exposed. If the transition is carried out too late, the DHF film will break into droplets, resulting in non-uniform etching and generation of particles. If the transition is carried out too early, the chemical/rinse treatment step must be carried out for a long time period in order to completely remove the silicon oxide film, resulting in increase of total consumption of DHF and reduction of throughput. Reduction in DHF consumption, uniform etching, and prevention of particle generation can be achieved by appropriately determining the transition timing. The transition timing can be determined through experiment.

After the chemical/rinse treatment step has been continued for the second time period, discharge of DHF is stopped, and the discharge rate of DIW is increased up to a second discharge rate (e.g., 0.5 l/min), while maintaining the rotation speed of the wafer W. Discharge of only DIW is continued for the third time period (e.g., 30 seconds). The above procedure is shown in FIG. 8(c), and is referred to as "rinse treatment step" hereinafter. In this rinse treatment step, water-diluted DHF on the wafer W is replaced with DIW.

After the completion of the rinse treatment step, discharge of DIW is stopped, and the swing arm 72 is returned to the home position. Alternatively, discharge of DIW may be stopped immediately after the integrated nozzle unit 90 has passed a position right above the periphery of the wafer W. Thereafter, the rotation speed of the wafer W is increased up to a second rotation speed (e.g., 3000 rpm) to scatter DIW remaining on the wafer W by centrifugal force, and thereby the wafer W is dried. The above procedure is shown in FIG. 8(d), and is referred to as "spin dry step" hereinafter.

According to the second embodiment, at least two remarkable advantages can be achieved. First, the DHF consumption can be considerably reduced, as compared with the conventional method in which the supply of DHF having a high HF concentration onto the wafer surface continues until the silicon oxide layer has been entirely removed. Second, the silicon layer is not exposed to DHF having a high HF concentration for a long time after the overlying silicon oxide film has been dissolved. This prevents undesirable damage to the silicon layer, and achieves uniform etching of the wafer W.

While particular embodiments of the present invention have been illustrated and described, it will also be apparent to those skilled in the art that various modifications can be made without departing from the spirit and scope of the present invention.

The chemical liquid is not limited to DHF, and may be BHF (Buffered HydroFluoric acid), for example.

The application of the present invention is not limited to removing the silicon oxide film unavoidably formed on the silicon wafer. The present invention is applicable to any kind of process for any kind of substrate including a step of removing the upper layer having a high wettability by a chemical liquid to expose the lower layer having a low wettability. The present invention is also applicable to any kind of process for any kind of substrate including a step of treating a layer having a high wettablity by a chemical liquid to alter the layer to possess a low wettablity. In this case, a rinse liquid is added to a chemical liquid before the layer alters to such an extent that a chemical liquid film formed on the layer breaks into droplets. For example, the present invention is applicable to a developing process, and is also applicable to a process for an LCD glass substrate.

What is claimed is:

1. A substrate processing method comprising:
providing a substrate having a lower layer having low wettability and an upper layer having high wettability arranged on the lower layer;
simultaneously supplying a chemical liquid and a rinse liquid onto the substrate, while moving a chemical-liquid supplying position on a surface of the substrate to which the chemical liquid is supplied from a periphery of the substrate toward a center of the substrate, and moving a rinse-liquid supplying position on the surface of the substrate to which the rinse liquid is supplied in such a manner that the rinse-liquid supplying position is located radially outside the chemical-liquid supplying position and follows the chemical-liquid supplying position, a relative positional relationship between the chemical-liquid supplying position and the rinse-liquid supplying position being essentially constant, whereby an area covered with a chemical liquid film of the chemical liquid and moving toward the center of the substrate is formed on the surface of the substrate between the chemical-liquid supplying position and the rinse-liquid supplying position, and the rinse liquid is supplied onto the chemical liquid film to form an area covered with a mixed liquid film of an mixture of the chemical liquid and the rinse liquid on the substrate radially outside the rinse-liquid supplying position, so that any portion of the surface of the substrate is primarily covered with the chemical liquid film for a period of time from a point of time at which the-chemical liquid supplying position reaches the portion to a point of time at which the rinse-liquid supplying position reaches the portion, and then covered with the mixed liquid film from a point of time at which the rinse-liquid supplying position reaches the portion,
wherein the period of time is determined so that the upper layer existing in the portion is partially removed by the chemical liquid to partially expose the underlying lower layer while partially remaining the upper layer in the portion non-removed during the period of time.

2. A method according to claim 1, wherein the period of time is determined beforehand by conducting an experiment by which a time necessary for removing the upper layer to expose the lower layer is measured.

3. A method according to claim 1, wherein the chemical liquid comprises hydrofluoric acid, and the upper layer is a silicon oxide film.

4. A method according to claim 1, wherein the supplying of the chemical liquid is stopped when the chemical-liquid supplying position reaches the center of the substrate.

5. A method according to claim 4, wherein the supplying of the rinse liquid is continued after stopping supplying the chemical-liquid, and the rinse-liquid supplying position is moved to the center of the substrate.

6. A method according to claim 5, wherein a rinse-liquid supplying rate is increased after the rinse-liquid supplying position is moved to the center of the substrate.

* * * * *